(12) United States Patent
Zin

(10) Patent No.: US 8,809,196 B2
(45) Date of Patent: Aug. 19, 2014

(54) METHOD OF ETCHING A THIN FILM USING PRESSURE MODULATION

(75) Inventor: Kelvin Kyaw Zin, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 880 days.

(21) Appl. No.: 12/353,634

(22) Filed: Jan. 14, 2009

(65) Prior Publication Data

US 2010/0178770 A1 Jul. 15, 2010

(51) Int. Cl.
*H01L 21/311* (2006.01)

(52) U.S. Cl.
CPC ............................... *H01L 21/31116* (2013.01)
USPC ............................. 438/710; 438/706; 438/714

(58) Field of Classification Search
USPC ......... 438/734, 258, 585, 622, 624, 628, 637, 438/638, 640, 680, 689, 691, 692, 694, 695, 438/696, 697, 699, 700, 706, 709, 71, 710, 438/711, 713, 714, 716, 719, 721, 723, 724, 438/740, 743; 118/723 E; 134/1.2; 156/345.26, 345.37, 345.42, 345.49; 204/192.12, 192.13, 192.37; 216/38, 216/47, 58, 62, 64, 67, 569; 430/325
See application file for complete search history.

(56) References Cited

U.S. PATENT DOCUMENTS

| | | | | |
|---|---|---|---|---|
| 4,713,141 A | * | 12/1987 | Tsang | 438/695 |
| 5,384,009 A | * | 1/1995 | Mak et al. | 438/696 |
| 6,030,902 A | * | 2/2000 | Donohoe | 438/714 |
| 6,096,160 A | * | 8/2000 | Kadomura | 156/345.49 |
| 6,284,149 B1 | * | 9/2001 | Li et al. | 216/64 |
| 6,333,271 B1 | * | 12/2001 | Chiu et al. | 438/706 |
| 6,383,918 B1 | * | 5/2002 | Ku et al. | 438/637 |
| 6,607,987 B2 | * | 8/2003 | Donohoe | 438/710 |
| 6,927,159 B2 | * | 8/2005 | Faust et al. | 438/628 |
| 2002/0142610 A1 | * | 10/2002 | Chien et al. | 438/710 |
| 2003/0181034 A1 | * | 9/2003 | Jiang et al. | 438/638 |
| 2003/0211750 A1 | * | 11/2003 | Kim et al. | 438/711 |
| 2004/0224520 A1 | * | 11/2004 | Yun et al. | 438/691 |
| 2008/0023440 A1 | * | 1/2008 | Chen et al. | 216/58 |
| 2008/0292973 A1 | | 11/2008 | Stamper | |

* cited by examiner

*Primary Examiner* — Duy Deo
*Assistant Examiner* — Erin Bergner
(74) *Attorney, Agent, or Firm* — Wood, Herron & Evans, LLP

(57) ABSTRACT

A method for transferring a feature pattern to a thin film on a substrate is described. The method comprises disposing a substrate comprising one or more mask layers overlying a thin film in a plasma processing system, and forming a feature pattern in the one or more mask layers. The method further comprises transferring the feature pattern in the one or more mask layers to the thin film by: performing a first plasma etching process at a first pressure less than about 80 mtorr, and performing a second plasma etching process at a second pressure greater than about 80 mtorr.

15 Claims, 11 Drawing Sheets

METHOD OF ETCHING A THIN FILM USING PRESSURE MODULATION

CROSS-REFERENCE TO RELATED APPLICATIONS

This application is related to pending U.S. patent application Ser. No. 11/751,086, entitled "METHOD FOR ETCHING A MULTI-LAYER MASK", filed on May 21, 2007; and pending U.S. patent application Ser. No. 12/024,258, entitled "METHOD FOR ETCHING SILICON-CONTAINING ARC LAYER WITH REDUCED CD BIAS", filed on Feb. 1, 2008. The entire contents of these applications are herein incorporated by reference in their entirety.

BACKGROUND OF THE INVENTION

1. Field of Invention

The invention relates to a method for pattern etching a substrate, and more particularly to a method for pattern etching a substrate while reducing the effects of micro-loading and feature roughness.

2. Description of Related Art

Typically, during fabrication of integrated circuits (ICs), semiconductor production equipment utilize a (dry) plasma etch process to remove or etch material along fine lines or within vias or contacts patterned on a semiconductor substrate. The success of the plasma etch process requires that the etch chemistry includes chemical reactants suitable for selectively etching one material while substantially not etching another material.

For example, on a semiconductor substrate, a pattern formed in a protective mask layer can be transferred to an underlying layer of a selected material utilizing a plasma etching process. The protective mask layer can comprise a radiation-sensitive layer, such as a photo-resist layer, having a pattern formed therein using a lithographic process.

In order to pattern finer features in the lithographic layer using conventional lithography techniques, multi-layer masks can be implemented. For example, the multi-layer mask may include a bilayer mask or trilayer mask including one or more soft mask layers, or one or more hard mask layers, or a combination thereof. With the inclusion of a second or third layer, the uppermost lithographic layer may be thinner than the thickness customarily chosen to withstand the subsequent dry etching process(es) and, therefore, using conventional lithography techniques, finer features may be formed in the thinner lithographic layer. Thereafter, the finer feature formed in the lithographic layer may be transferred to the underlying second or third layers using a dry development process, such as a dry etching process.

Once the pattern is established in the multi-layer mask, the pattern is transferred to the underlying layers using one or more etching processes. Examples of such an etching process include reactive ion etching (RIE), which is in essence an ion activated chemical etching process. However, although RIE has been in use for decades, its maturity is accompanied by several issues including, among other things, feature-shape loading effects (i.e., micro-loading) and critical dimension (CD) control. A loading effect is generally used to describe an etching process having an etch rate that depends upon the exposed area. Local variations in the pattern density of the pattern being transferred using the etching process can cause local variations in the etch rate due to local depletion of the reactive species and this effect is referred to as micro-loading. It is essential that the micro-loading effect is reduced in order to mitigate RIE lag. Moreover, as pattern feature dimensions become finer, RIE lag worsens.

Additionally, it is essential that a critical dimension (CD) for the mask layer is preserved during pattern transfer such that the CD bias is minimal, i.e., the CD bias is the difference between the initial CD for the pattern in the mask layer and the final CD for the pattern in the underlying layer(s). Further, if a CD bias is unavoidable, it is essential that the CD bias is uniformly maintained across the substrate. Further yet, if a CD bias is unavoidable, it is essential that the offset in CD bias between dense features (e.g., closely spaced features) and isolated features (e.g., widely spaced features) is minimal.

Furthermore, during pattern transfer, undulations or variations in the edge profile of the pattern in the mask layer as well as variations in pattern dimension, can be propagated in to the underlying layers. These undulations or variations may be observed as edge roughness or line edge roughness (LER) in some instances, or as pitting in other instances. Edge roughness may arise due to damage to the layer of radiation-sensitive material. During the application of the radiation-sensitive material, the post-application bake (PAB), the exposure step, the post-exposure bake (PEB), or the wet developing step, or any combination thereof, the radiation-sensitive material may be damaged. Moreover, damage may occur during the initial phases of the ARC layer etch, hard mask etch, or thin film etch. Pitting may arise when performing pattern transfer in a porous material, such as porous low dielectric constant (low-k) materials or porous ultra-low-k materials.

SUMMARY OF THE INVENTION

The invention relates to a method for transferring a feature pattern to a substrate.

The invention also relates to a method for transferring a feature pattern to a substrate while reducing the effects of micro-loading and feature roughness.

According to one embodiment, a method for transferring a feature pattern to a thin film on a substrate is described. The method comprises disposing a substrate comprising one or more mask layers overlying a thin film in a plasma processing system, and forming a feature pattern in the one or more mask layers. The method further comprises transferring the feature pattern in the one or more mask layers to the thin film by: performing a first plasma etching process at a first pressure less than about 80 mtorr, and performing a second plasma etching process at a second pressure greater than about 80 mtorr.

According to another embodiment, a method of transferring a pattern to a substrate is described. The method comprises disposing a substrate comprising one or more mask layers overlying a thin film in a plasma processing system, and forming a feature pattern in the one or more mask layers. The method further comprises transferring the feature pattern in the one or more mask layers to the thin film while: reducing micro-loading using a first plasma etching process at a first pressure, and reducing feature roughness using a second plasma etching process at a second pressure greater than the first pressure.

According to yet another embodiment, a method of transferring a pattern to a substrate is described. The method comprises disposing a substrate comprising one or more mask layers overlying a thin film in a plasma processing system; forming a feature pattern in the one or more mask layers; and transferring the feature pattern in the one or more mask layers to the thin film using a plasma etching process, wherein a pressure for the plasma etching process is modulated between a first pressure for reducing micro-loading and a second pressure for reducing roughness.

DETAILED DESCRIPTION OF SEVERAL EMBODIMENTS

Figure 1:
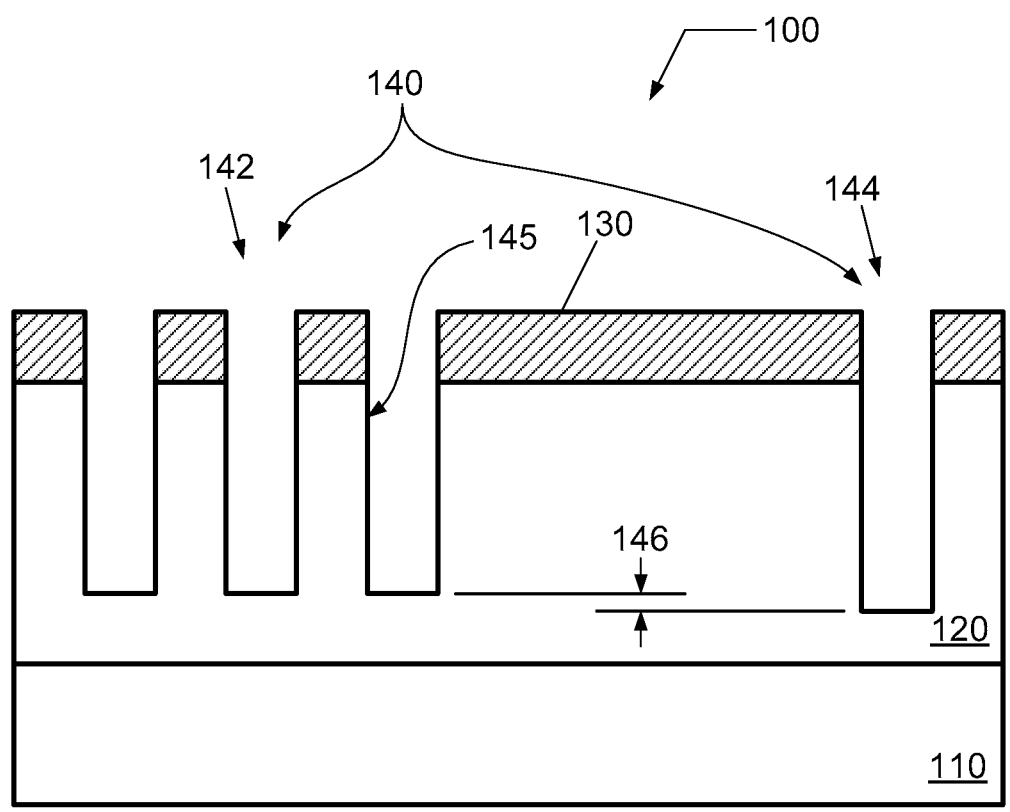
FIG. 1 illustrates a schematic representation of a procedure for etching a feature pattern in a substrate according to an embodiment.

In the following description, for purposes of explanation and not limitation, specific details are set forth, such as a particular geometry of a processing system, descriptions of various components and processes used therein. However, it should be understood that the invention may be practiced in other embodiments that depart from these specific details.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" or variation thereof means that a particular feature, structure, material, or characteristic described in connection with the embodiment is included in at least one embodiment of the invention, but do not denote that they are present in every embodiment. Thus, the appearances of the phrases such as "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

"Substrate" as used herein generically refers to the object being processed in accordance with the invention. The substrate may include any material portion or structure of a device, particularly a semiconductor or other electronics device, and may, for example, be a base substrate structure, such as a semiconductor wafer or a layer on or overlying a base substrate structure such as a thin film. Thus, substrate is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation.

As described above, micro-loading effects continue to be an issue with etching processes during pattern transfer. Micro-loading effects include RIE lag, whose occurrence causes dense features to etch at a slower rate than isolated features. Furthermore, as described above, undulations or variations in the edge profile of the pattern as well as variations in pattern dimension, can be propagated in to the underlying layers. These undulations may be observed as feature roughness, e.g., line edge roughness (LER) or pitting. Hence, there still exists a need to improve micro-loading effects (or reduce RIE lag) and correct for pattern deficiencies in the lithographic layer, such as edge roughness and pitting. During pattern transfer, conventional process chemistries fail to reduce RIE lag, while reducing or maintaining the CD and reducing feature roughness.

Therefore, according to an embodiment, a method for transferring a feature pattern to a thin film on a substrate is described. As illustrated in FIG. 1, a thin film 120 is formed on a substrate 110, and one or more mask layers 130 are formed atop the thin film 120. The method comprises disposing substrate 110 comprising one or more mask layers 130 overlying thin film 120 in a plasma processing system, and forming a feature pattern 140 in the one or more mask layers 130. The pattern density of feature pattern 140 may vary across substrate 110, wherein the feature pattern 140 may include nested features 142 (i.e., closely spaced) and isolated features 144 (i.e., widely spaced).

The method further comprises transferring the feature pattern 140 in the one or more mask layers 130 to the thin film 120 while reducing micro-loading using a first plasma etching process at a first pressure, and reducing feature roughness 145 using a second plasma etching process at a second pressure greater than the first pressure. The effect of micro-loading is illustrated in FIG. 1 by showing a difference 146 in etch depth for the nested features 142 and the isolated feature 144 at an instant in time during pattern transfer. The inventors have observed that low pressure assists in reducing RIE lag, i.e., reducing difference 146, and high pressure assists in reducing feature roughness 145, such as pitting.

Figure 2:
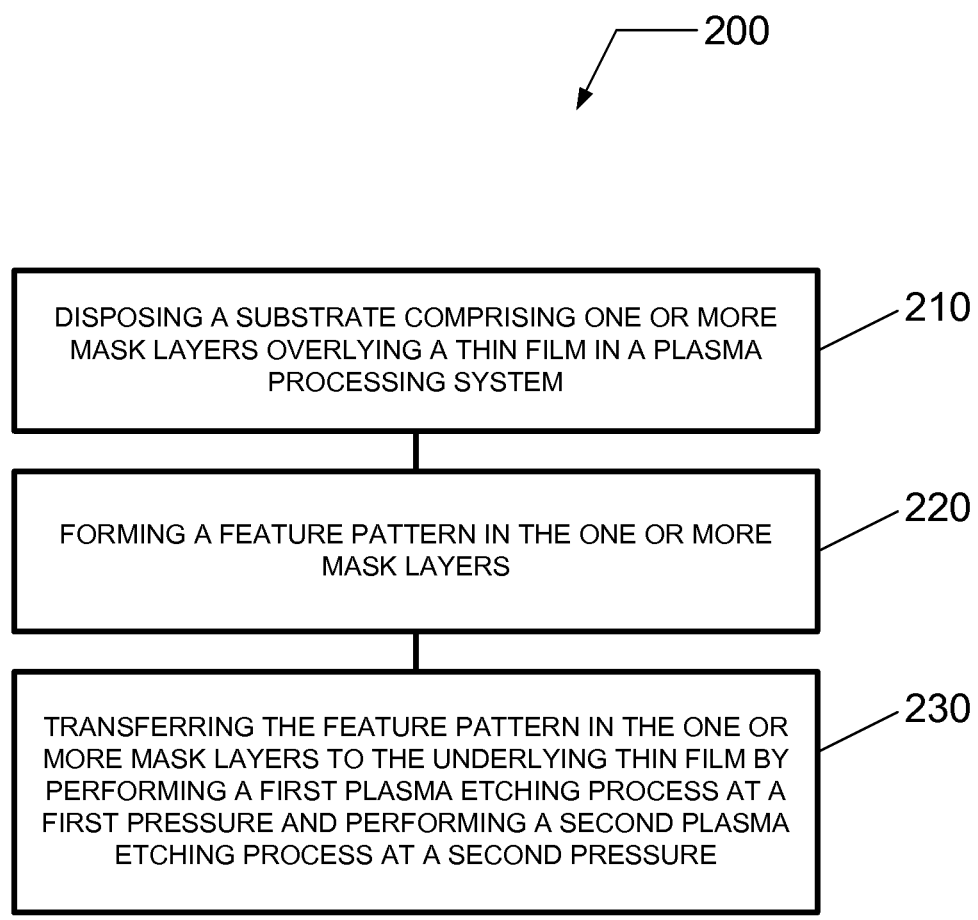
FIG. 2 provides a flow chart illustrating a method of etching a feature in a substrate according to an embodiment.

According to another embodiment, a method for transferring a feature pattern to a thin film on a substrate is illustrated in a flow chart 200 in FIG. 2. The method begins in 210 with disposing a substrate comprising one or more mask layers overlying a thin film in a plasma processing system. The one or more mask layers may comprise a lithographic layer, including a layer of radiation-sensitive material such as photo-resist, an anti-reflective coating (ARC) layer, a soft mask layer, a hard mask layer, or a planarization layer, or any combination of two or more thereof. Other layers and/or structures may be disposed between the thin film and the underlying substrate. The substrate may comprise a semiconductor substrate, a wafer, a flat panel display or a liquid crystal display.

The thin film may comprise a conductive layer, a non-conductive layer, or a semi-conductive layer. For instance, the thin film may include a material layer comprising a metal, metal oxide, metal nitride, metal oxynitride, metal silicate, metal silicide, silicon, poly-crystalline silicon (poly-silicon), doped silicon, silicon dioxide, silicon nitride, silicon carbide, or silicon oxynitride, etc. Additionally, for instance, the thin film may comprise a low dielectric constant (i.e., low-k) or ultra-low dielectric constant (i.e., ultra-low-k) dielectric layer having a nominal dielectric constant value less than the dielectric constant of $SiO_2$, which is approximately 4 (e.g., the dielectric constant for thermal silicon dioxide can range from 3.8 to 3.9). More specifically, the thin film may have a dielectric constant of less than 3.7, or a dielectric constant ranging from 1.6 to 3.7.

These dielectric layers may include at least one of an organic, inorganic, or inorganic-organic hybrid material. Additionally, these dielectric layers may be porous or non-porous.

For example, these dielectric layers may include an inorganic, silicate-based material, such as carbon doped silicon oxide (or organo siloxane), deposited using CVD techniques. Examples of such films include Black Diamond® CVD organosilicate glass (OSG) films commercially available from Applied Materials, Inc., or Coral® CVD films commercially available from Novellus Systems, Inc.

Alternatively, these dielectric layers may include porous inorganic-organic hybrid films comprised of a single-phase, such as a silicon oxide-based matrix having $CH_3$ bonds that hinder full densification of the film during a curing or deposition process to create small voids (or pores). Still alternatively, these dielectric layers may include porous inorganic-organic hybrid films comprised of at least two phases, such as a carbon-doped silicon oxide-based matrix having pores of organic material (e.g., porogen) that is decomposed and evaporated during a curing process.

Still alternatively, these dielectric layers may include an inorganic, silicate-based material, such as hydrogen silsesquioxane (HSQ) or methyl silsesquioxane (MSQ), deposited using SOD (spin-on dielectric) techniques. Examples of such films include FOx® HSQ commercially available from Dow Corning, XLK porous HSQ commercially available from Dow Corning, and JSR LKD-5109 commercially available from JSR Microelectronics.

Still alternatively, these dielectric layers can comprise an organic material deposited using SOD techniques. Examples of such films include SiLK-I, SiLK-J, SiLK-H, SiLK-D, and porous SiLK® semiconductor dielectric resins commercially available from Dow Chemical, and GX-3™, and GX-3P™ semiconductor dielectric resins commercially available from Honeywell.

The thin film can be formed using a vapor deposition technique, such as chemical vapor deposition (CVD), plasma enhanced CVD (PECVD), atomic layer deposition (ALD), plasma enhanced ALD (PEALD), physical vapor deposition (PVD), or ionized PVD (iPVD), or a spin-on technique, such as those offered in the Clean Track ACT 8 SOD (spin-on dielectric), ACT 12 SOD, and Lithius coating systems commercially available from Tokyo Electron Limited (TEL) (Tokyo, Japan). The Clean Track ACT 8 (200 mm), ACT 12 (300 mm), and Lithius (300 mm) coating systems provide coat, bake, and cure tools for SOD materials. The track system can be configured for processing substrate sizes of 100 mm, 200 mm, 300 mm, and greater. Other systems and methods for forming a thin film on a substrate are well known to those skilled in the art of both spin-on technology and vapor deposition technology.

As described above, the one or more mask layers may comprise a lithographic layer. The lithographic layer may comprise a layer of radiation-sensitive material, such as photo-resist. The photo-resist layer may comprise 248 nm (nanometer) resists, 193 nm resists, 157 nm resists, EUV (extreme ultraviolet) resists, or electron beam sensitive resist. The photo-resist layer can be formed using a track system. For example, the track system can comprise a Clean Track ACT 8, ACT 12, or Lithius resist coating and developing system commercially available from Tokyo Electron Limited (TEL). Other systems and methods for forming a photo-resist layer on a substrate are well known to those skilled in the art of spin-on resist technology.

In 220, a feature pattern is formed in the one or more mask layers. The feature pattern may be formed using photo-lithography, electron beam lithography, imprint lithography, wet etching, or dry etching, or any combination of two or more thereof. The feature pattern may comprise narrow lines and/or vias, wide lines and/or vias, nested features, isolated features, etc.

In photo-lithography, a lithographic layer is imaged with an image pattern. Therein, the lithographic layer is exposed to EM radiation through a reticle in a dry or wet photo-lithography system. The image pattern can be formed using any suitable conventional stepping lithographic system, or scanning lithographic system. The photo-lithographic system may be commercially available from ASML Netherlands B.V. (De Run 6501, 5504 DR Veldhoven, The Netherlands), or Canon USA, Inc., Semiconductor Equipment Division (3300 North First Street, San Jose, Calif. 95134). Although photo-lithography is described above, other techniques may be used to form the image pattern in the lithographic layer. Other techniques may include direct-write or non-direct write techniques including electron beam patterning systems. Thereafter, the image pattern is developed in the lithographic layer to form the feature pattern having a first critical dimension (CD). The developing process can include exposing the substrate to a developing solvent in a developing system, such as a track system. For example, the track system can comprise a Clean Track ACT 8, ACT 12, or Lithius resist coating and developing system commercially available from Tokyo Electron Limited (TEL).

In 230, the feature pattern formed in the one or more mask layers is transferred to the thin film by performing a first plasma etching process at a first pressure less than about 80 mtorr (millitorr), and performing a second plasma etching process at a second pressure greater than about 80 mtorr. The first and second plasma etching processes may each comprise introducing a process gas to the plasma processing system according to a process recipe, forming plasma from the process gas in the plasma processing system according to the process recipe, and exposing the substrate to the plasma. Alternatively, the first pressure may be about 50 mtorr or less, and the second pressure may be about 150 mtorr or more.

For example, the first plasma etching process may comprise: introducing a fluorocarbon-containing gas and an oxygen-containing gas to the plasma processing system; setting the first pressure in the plasma processing system; and forming plasma from the fluorocarbon-containing gas and the oxygen-containing gas. The fluorocarbon-containing gas may comprise at least one $C_xF_yH_z$-containing gas, wherein x and y are integers greater than or equal to unity and z is an integer greater than or equal to zero. The $C_xF_yH_z$-containing gas may include any gas containing carbon (C) and fluorine (F) (e.g., a fluorocarbon gas), or any gas containing C, F and hydrogen (H) (e.g., a hydrofluorocarbon gas). The fluorocarbon gas may include $CF_4$, $C_3F_6$, $C_4F_6$, $C_4F_8$, or $C_5F_8$, or any combination of two or more thereof. Additionally, the hydrofluorocarbon gas may include introducing trifluoromethane ($CHF_3$), or difluoromethane ($CH_2F_2$), or both. Furthermore, the oxygen-containing gas may include $O_2$, CO, $CO_2$, NO, $NO_2$, or $N_2O$, or any combination of two or more thereof.

For instance, the first plasma etching process may include a process that utilizes plasma formed from a process gas containing $CF_4$ and CO.

Additionally, for example, the second plasma etching process may comprise: introducing a fluorocarbon-containing gas and an oxygen-containing gas to the plasma processing system; setting the second pressure in the plasma processing system; and forming plasma from the fluorocarbon-containing gas and the oxygen-containing gas. The fluorocarbon-containing gas may comprise at least one $C_xF_yH_z$-containing gas, wherein x and y are integers greater than or equal to unity and z is an integer greater than or equal to zero. The $C_xF_yH_z$-containing gas may include any gas containing carbon (C) and fluorine (F) (e.g., a fluorocarbon gas), or any gas containing C, F and hydrogen (H) (e.g., a hydrofluorocarbon gas). The fluorocarbon gas may include $CF_4$, $C_3F_6$, $C_4F_6$, $C_4F_8$, or $C_5F_8$, or any combination of two or more thereof. Additionally, the hydrofluorocarbon gas may include introducing trifluoromethane ($CHF_3$), or difluoromethane ($CH_2F_2$), or both. Furthermore, the oxygen-containing gas may include $O_2$, CO, $CO_2$, NO, $NO_2$, or $N_2O$, or any combination of two or more thereof.

For instance, the second plasma etching process may include a process that utilizes plasma formed from a process gas containing $CF_4$ and CO.

The first plasma etching process or the second plasma etching process or both may include the addition of an inert gas, such as a noble gas.

The order of the first plasma etching process and the second plasma etching process may be such that the first plasma etching process precedes the second plasma etching process. Therein, the first plasma etching process may proceed for a first duration of time, and the second plasma etching process may proceed for a second duration of time. Additionally, the first duration of time exceeds the second duration of time. However, the second duration of time may exceed the first duration of time. The first duration of time may be selected to be sufficiently long to partially transfer the feature pattern into the thin film. The second duration of time may be selected to be sufficiently long to complete the feature pattern into the thin film.

Alternatively, the order of the first plasma etching process and the second plasma etching process may be such that the first plasma etching process follows the second plasma etching process. Alternatively yet, the first plasma etching process and the second plasma etching process may be alternatingly repeated two or more cycles until the feature pattern is transferred to the thin film.

Figure 3:
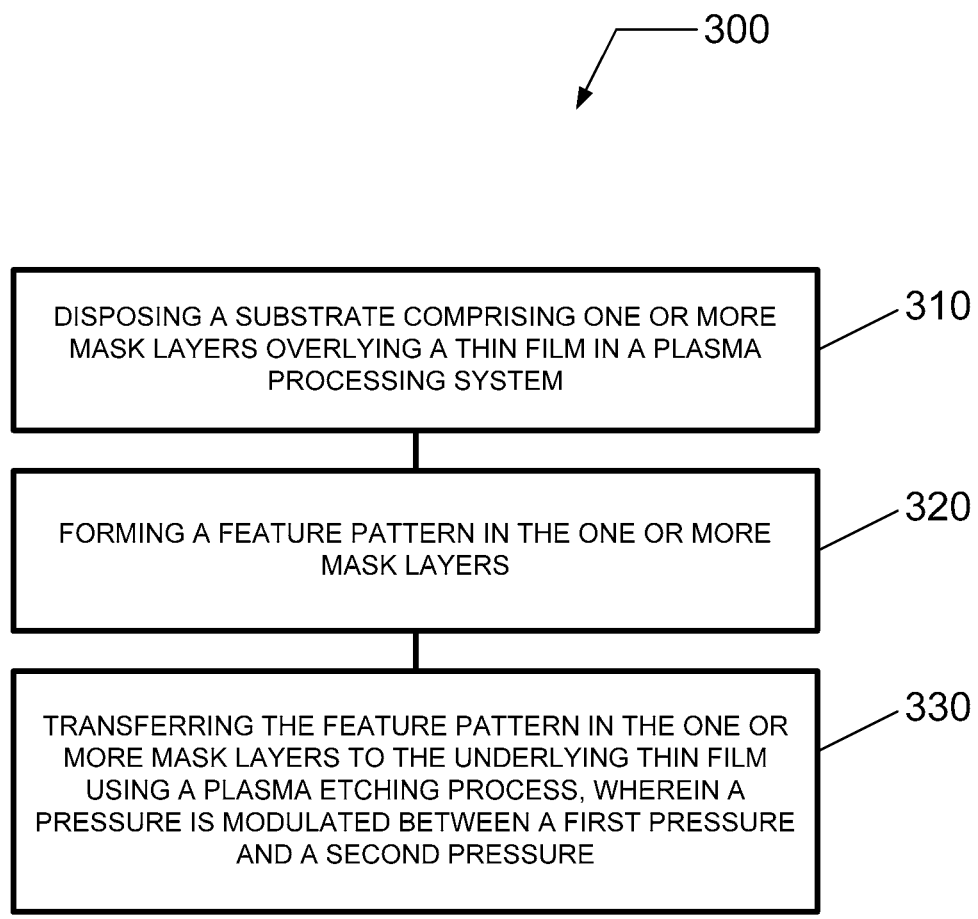
FIG. 3 provides a flow chart illustrating a method of etching a feature in a substrate according to another embodiment.

According to yet another embodiment, a method for transferring a feature pattern to a thin film on a substrate is illustrated in a flow chart 300 in FIG. 3. The method begins in 310 with disposing a substrate comprising one or more mask layers overlying a thin film in a plasma processing system.

In 320, a feature pattern is formed in the one or more mask layers.

In 330, the feature pattern formed in the one or more mask layers is transferred to the thin film using a plasma etching process, wherein a pressure is modulated between a first pressure and a second pressure during the plasma etching process.

Figure 4:
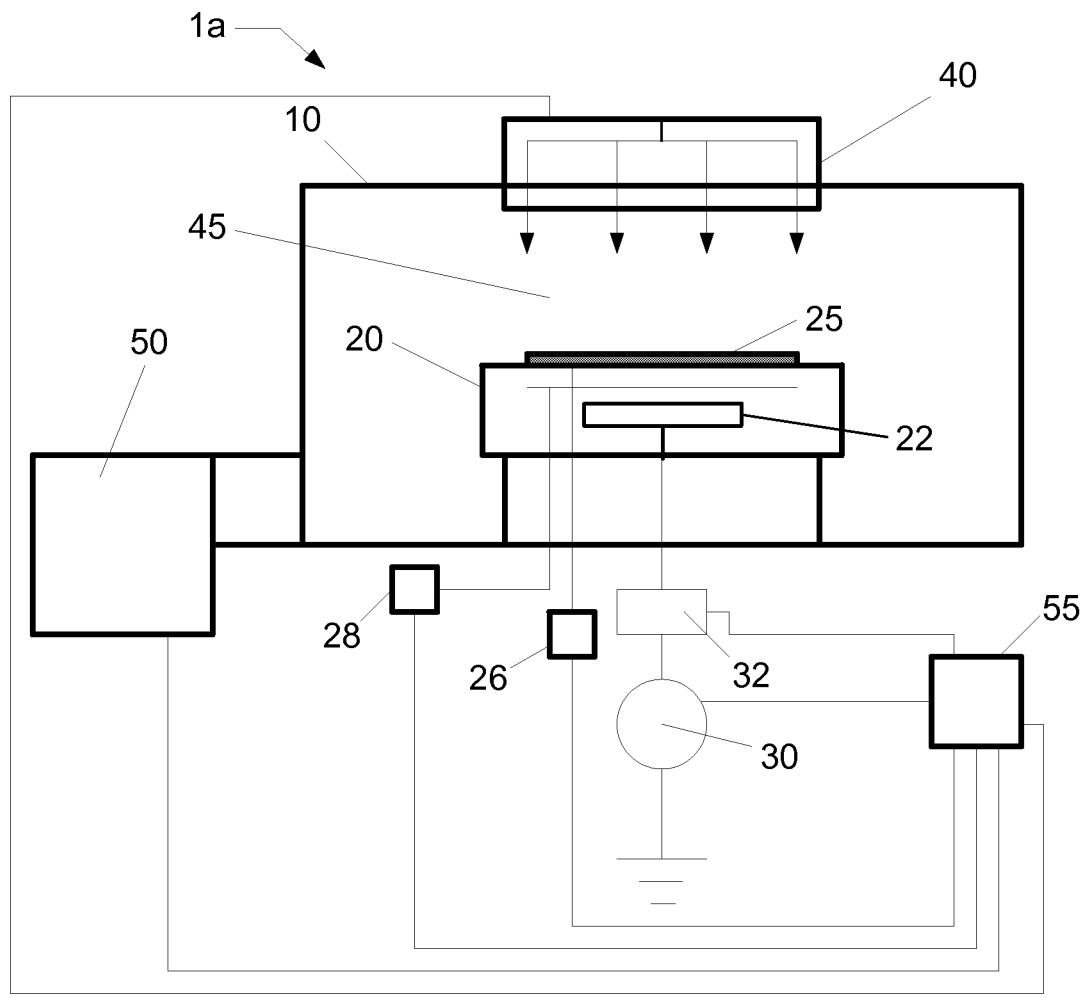
FIG. 4 shows a schematic representation of a processing system according to an embodiment.

According to one embodiment, a processing system 1a configured to perform the above identified process conditions is depicted in FIG. 4 comprising a plasma processing chamber 10, substrate holder 20, upon which a substrate 25 to be processed is affixed, and vacuum pumping system 50. Substrate 25 can be a semiconductor substrate, a wafer, a flat panel display, or a liquid crystal display. Plasma processing chamber 10 can be configured to facilitate the generation of plasma in processing region 45 in the vicinity of a surface of substrate 25. An ionizable gas or mixture of process gases is introduced via a gas distribution system 40. For a given flow of process gas, the process pressure is adjusted using the vacuum pumping system 50. Plasma can be utilized to create materials specific to a pre-determined materials process, and/or to aid the removal of material from the exposed surfaces of substrate 25. The plasma processing system 1a can be configured to process substrates of any desired size, such as 200 mm substrates, 300 mm substrates, or larger.

Substrate 25 can be affixed to the substrate holder 20 via a clamping system 28, such as a mechanical clamping system or an electrical clamping system (e.g., an electrostatic clamping system). Furthermore, substrate holder 20 can include a heating system (not shown) or a cooling system (not shown) that is configured to adjust and/or control the temperature of substrate holder 20 and substrate 25. The heating system or cooling system may comprise a re-circulating flow of heat transfer fluid that receives heat from substrate holder 20 and transfers heat to a heat exchanger system (not shown) when cooling, or transfers heat from the heat exchanger system to substrate holder 20 when heating. In other embodiments, heating/cooling elements, such as resistive heating elements, or thermoelectric heaters/coolers can be included in the substrate holder 20, as well as the chamber wall of the plasma processing chamber 10 and any other component within the processing system 1a.

Additionally, a heat transfer gas can be delivered to the backside of substrate 25 via a backside gas supply system 26 in order to improve the gas-gap thermal conductance between substrate 25 and substrate holder 20. Such a system can be utilized when temperature control of the substrate is required at elevated or reduced temperatures. For example, the backside gas supply system can comprise a two-zone gas distribution system, wherein the helium gas-gap pressure can be independently varied between the center and the edge of substrate 25.

In the embodiment shown in FIG. 4, substrate holder 20 can comprise an electrode 22 through which RF power is coupled to the processing plasma in processing region 45. For example, substrate holder 20 can be electrically biased at a RF voltage via the transmission of RF power from a RF generator 30 through an optional impedance match network 32 to substrate holder 20. The RF bias can serve to heat electrons to form and maintain plasma. In this configuration, the system can operate as a reactive ion etch (RIE) reactor, wherein the chamber and an upper gas injection electrode serve as ground surfaces. A typical frequency for the RF bias can range from about 0.1 MHz to about 100 MHz. RF systems for plasma processing are well known to those skilled in the art.

Alternately, RF power is applied to the substrate holder electrode at multiple frequencies. Furthermore, impedance match network 32 can improve the transfer of RF power to plasma in plasma processing chamber 10 by reducing the reflected power. Match network topologies (e.g. L-type, π-type, T-type, etc.) and automatic control methods are well known to those skilled in the art.

Gas distribution system 40 may comprise a showerhead design for introducing a mixture of process gases. Alternatively, gas distribution system 40 may comprise a multi-zone showerhead design for introducing a mixture of process gases and adjusting the distribution of the mixture of process gases above substrate 25. For example, the multi-zone showerhead design may be configured to adjust the process gas flow or composition to a substantially peripheral region above substrate 25 relative to the amount of process gas flow or composition to a substantially central region above substrate 25.

Vacuum pumping system 50 can include a turbo-molecular vacuum pump (TMP) capable of a pumping speed up to about 5000 liters per second (and greater) and a gate valve for throttling the chamber pressure. In conventional plasma processing devices utilized for dry plasma etch, a 1000 to 3000 liter per second TMP can be employed. TMPs are useful for low pressure processing, typically less than about 50 mtorr. For high pressure processing (i.e., greater than about 100 mtorr), a mechanical booster pump and dry roughing pump can be used. Furthermore, a device for monitoring chamber pressure (not shown) can be coupled to the plasma processing chamber 10. The pressure measuring device can be, for example, a Type 628B Baratron absolute capacitance manometer commercially available from MKS Instruments, Inc. (Andover, Mass.).

Controller 55 comprises a microprocessor, memory, and a digital I/O port capable of generating control voltages sufficient to communicate and activate inputs to plasma processing system 1a as well as monitor outputs from plasma processing system 1a. Moreover, controller 55 can be coupled to and can exchange information with RF generator 30, impedance match network 32, the gas distribution system 40, vacuum pumping system 50, as well as the substrate heating/cooling system (not shown), the backside gas delivery system 26, and/or the electrostatic clamping system 28. For example, a program stored in the memory can be utilized to activate the inputs to the aforementioned components of plasma processing system 1a according to a process recipe in order to perform a plasma assisted process on substrate 25.

Controller 55 can be locally located relative to the processing system 1a, or it can be remotely located relative to the processing system 1a. For example, controller 55 can exchange data with processing system 1a using a direct connection, an intranet, and/or the internet. Controller 55 can be coupled to an intranet at, for example, a customer site (i.e., a device maker, etc.), or it can be coupled to an intranet at, for example, a vendor site (i.e., an equipment manufacturer). Alternatively or additionally, controller 55 can be coupled to the internet. Furthermore, another computer (i.e., controller, server, etc.) can access controller 55 to exchange data via a direct connection, an intranet, and/or the internet.

In the embodiment shown in FIG. 5, processing system 1b can be similar to the embodiment of FIG. 4 and further comprise either a stationary, or mechanically or electrically rotating magnetic field system 60, in order to potentially increase plasma density and/or improve plasma processing uniformity, in addition to those components described with reference to FIG. 3. Moreover, controller 55 can be coupled to magnetic field system 60 in order to regulate the speed of rotation and field strength. The design and implementation of a rotating magnetic field is well known to those skilled in the art.

Figure 5:
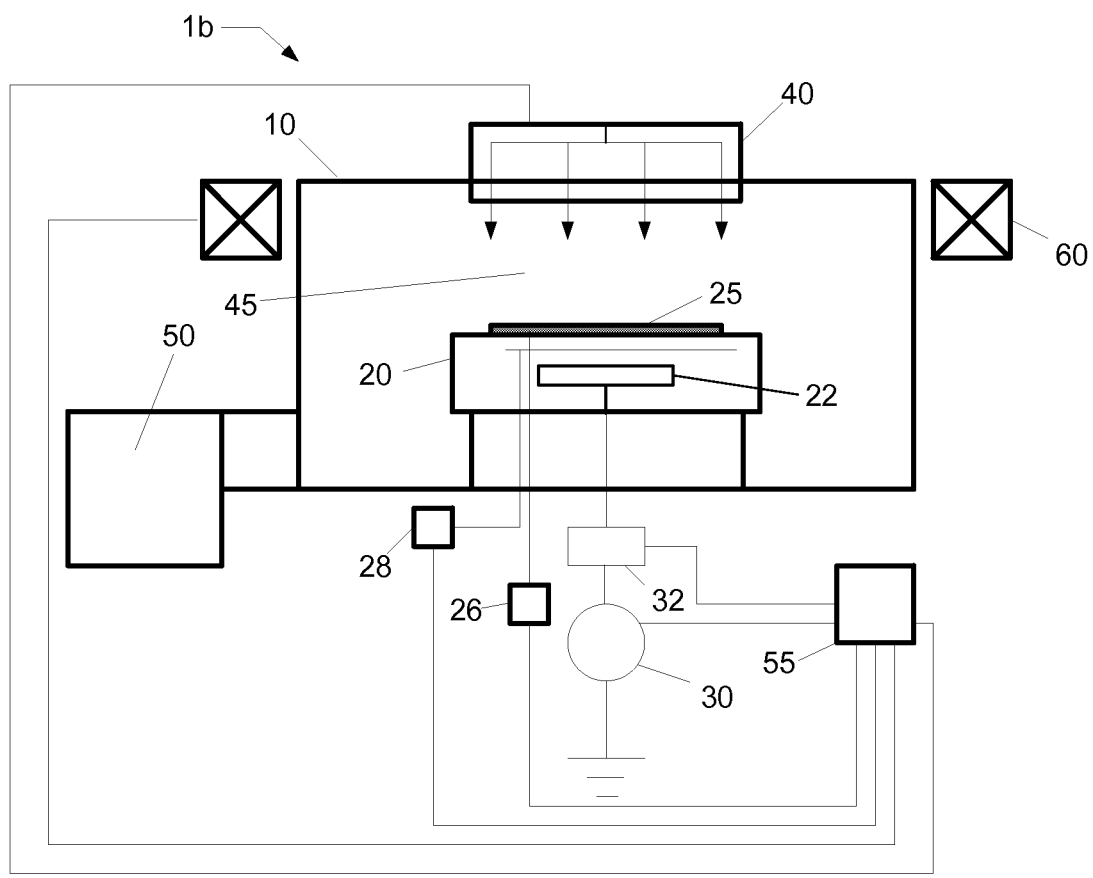
FIG. 5 shows a schematic representation of a processing system according to another embodiment.
Figure 6:
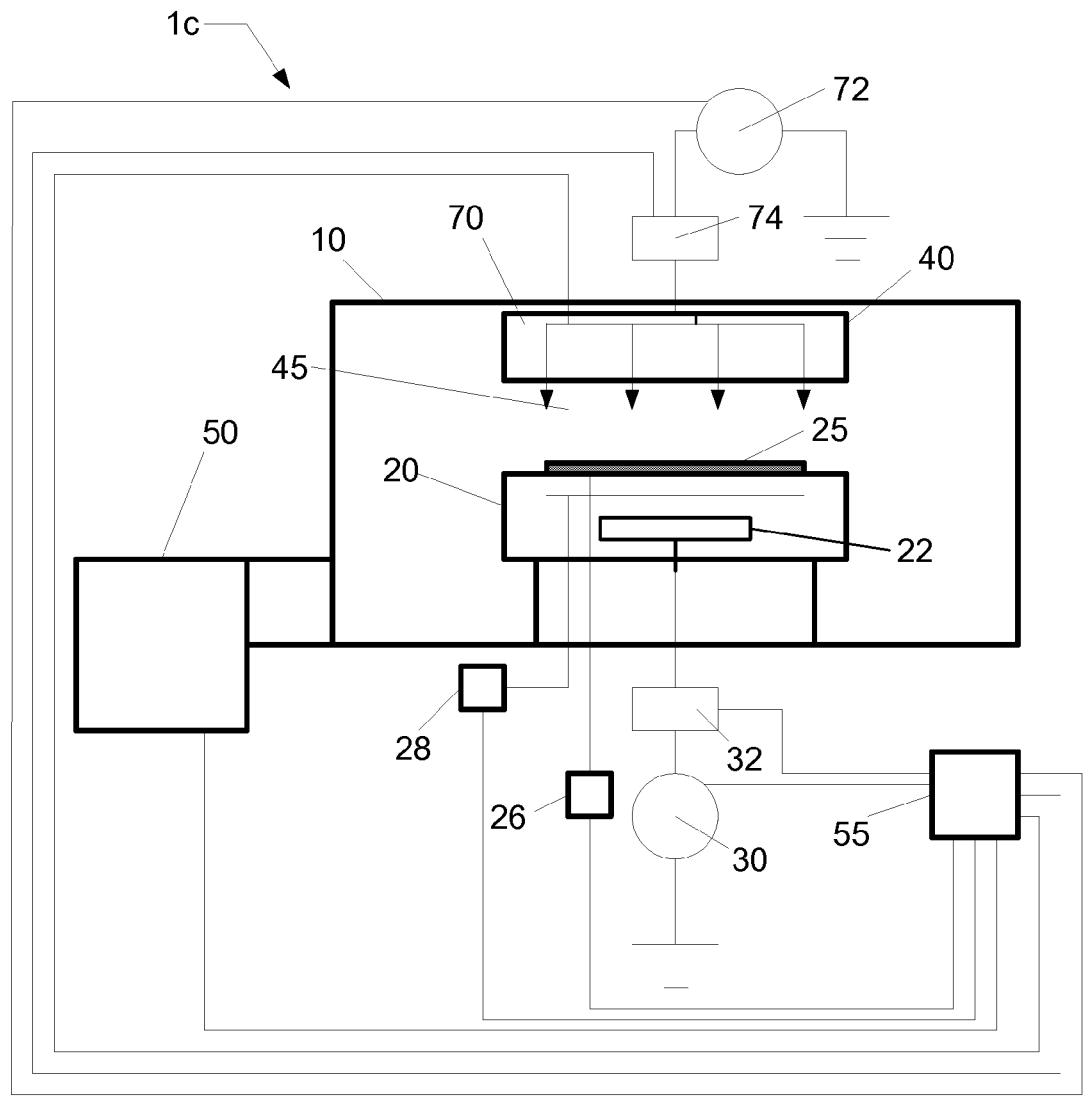
FIG. 6 shows a schematic representation of a processing system according to another embodiment.

In the embodiment shown in FIG. 6, processing system 1c can be similar to the embodiment of FIG. 4 or FIG. 5, and can further comprise an upper electrode 70 to which RF power can be coupled from RF generator 72 through optional impedance match network 74. A frequency for the application of RF power to the upper electrode can range from about 0.1 MHz to about 200 MHz. Additionally, a frequency for the application of power to the lower electrode can range from about 0.1 MHz to about 100 MHz. Moreover, controller 55 is coupled to RF generator 72 and impedance match network 74 in order to control the application of RF power to upper electrode 70. The design and implementation of an upper electrode is well known to those skilled in the art. The upper electrode 70 and the gas distribution system 40 can be designed within the same chamber assembly, as shown.

Figure 7:
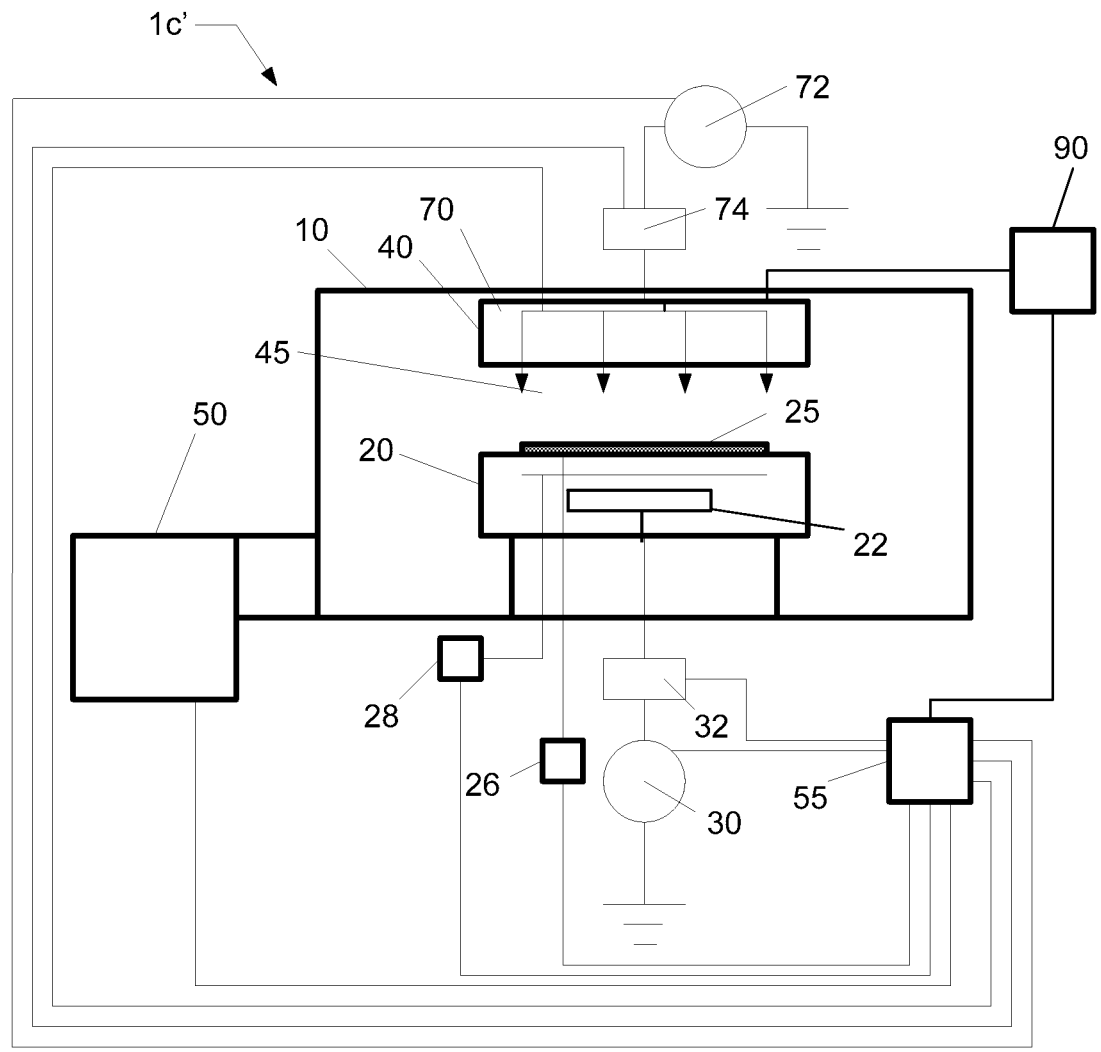
FIG. 7 shows a schematic representation of a processing system according to another embodiment.

In the embodiment shown in FIG. 7, processing system 1c' can be similar to the embodiment of FIG. 6, and can further comprise a direct current (DC) power supply 90 coupled to the upper electrode 70 opposing substrate 25. The upper electrode 70 may comprise an electrode plate. The electrode plate may comprise a silicon-containing electrode plate. Moreover, the electrode plate may comprise a doped silicon electrode plate. The DC power supply 90 can include a variable DC power supply. Additionally, the DC power supply can include a bipolar DC power supply. The DC power supply 90 can further include a system configured to perform at least one of monitoring adjusting, or controlling the polarity, current, voltage, or on/off state of the DC power supply 90. Once plasma is formed, the DC power supply 90 facilitates the formation of a ballistic electron beam. An electrical filter (not shown) may be utilized to de-couple RF power from the DC power supply 90.

For example, the DC voltage applied to upper electrode 70 by DC power supply 90 may range from approximately −2000 volts (V) to approximately 1000 V. Desirably, the absolute value of the DC voltage has a value equal to or greater than approximately 100 V, and more desirably, the absolute value of the DC voltage has a value equal to or greater than approximately 500 V. Additionally, it is desirable that the DC voltage has a negative polarity. Furthermore, it is desirable that the DC voltage is a negative voltage having an absolute value greater than the self-bias voltage generated on a surface of the upper electrode 70. The surface of the upper electrode 70 facing the substrate holder 20 may be comprised of a silicon-containing material.

Figure 8:
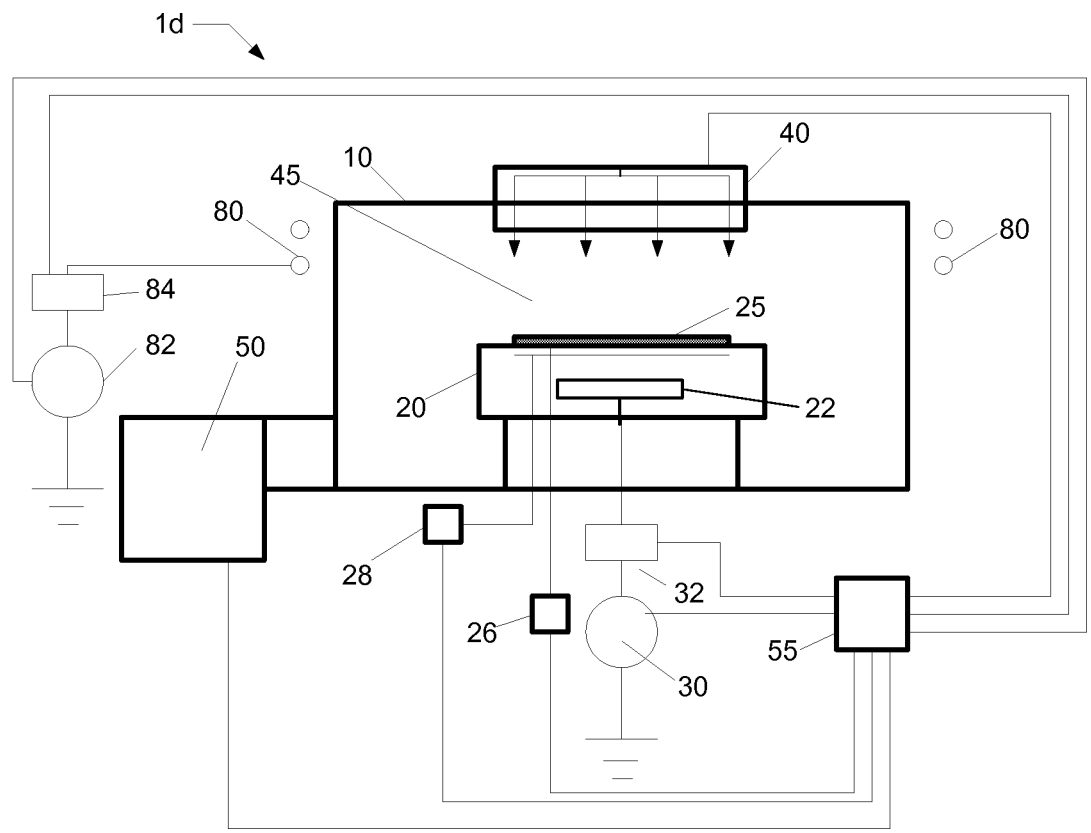
FIG. 8 shows a schematic representation of a processing system according to another embodiment.

In the embodiment shown in FIG. 8, the processing system 1d can be similar to the embodiments of FIGS. 4 and 5, and can further comprise an inductive coil 80 to which RF power is coupled via RF generator 82 through optional impedance match network 84. RF power is inductively coupled from inductive coil 80 through a dielectric window (not shown) to plasma processing region 45. A frequency for the application of RF power to the inductive coil 80 can range from about 10 MHz to about 100 MHz. Similarly, a frequency for the application of power to the chuck electrode can range from about 0.1 MHz to about 100 MHz. In addition, a slotted Faraday shield (not shown) can be employed to reduce capacitive coupling between the inductive coil 80 and plasma in the processing region 45. Moreover, controller 55 can be coupled to RF generator 82 and impedance match network 84 in order to control the application of power to inductive coil 80.

Figure 9:
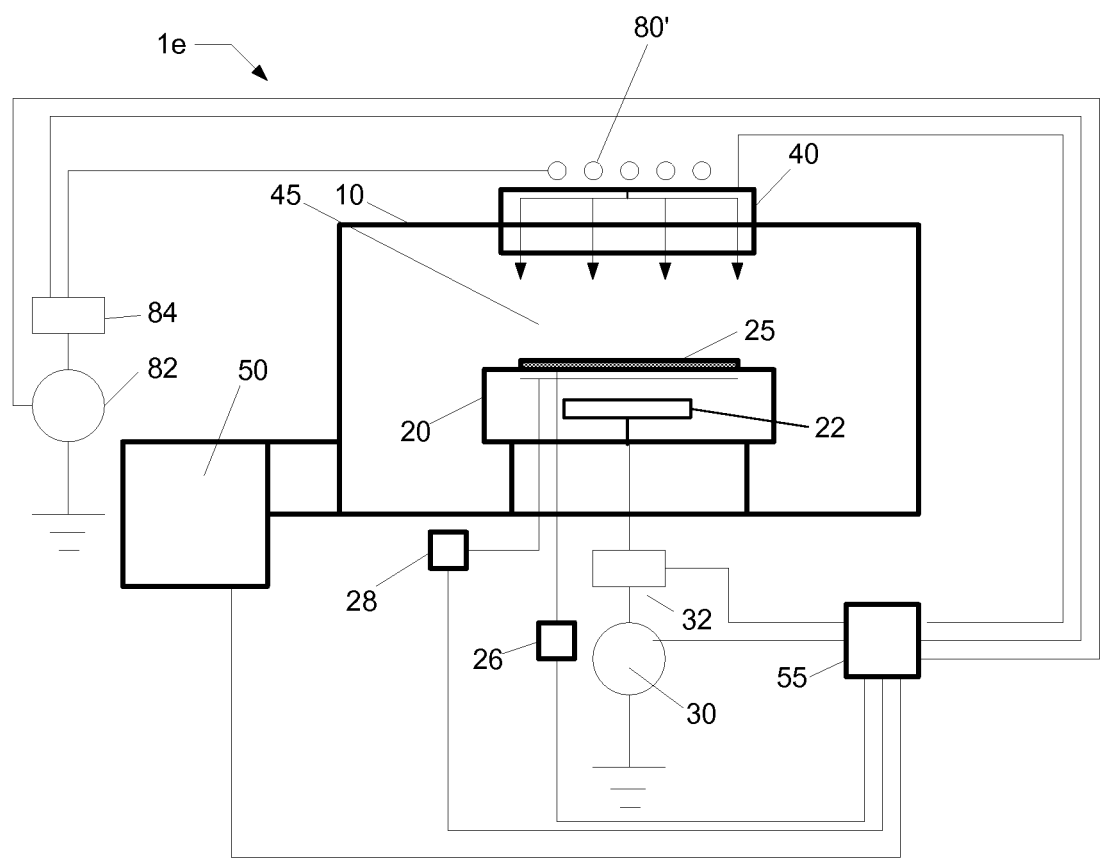
FIG. 9 shows a schematic representation of a processing system according to another embodiment.

In an alternate embodiment, as shown in FIG. 9, the processing system 1e can be similar to the embodiment of FIG. 8, and can further comprise an inductive coil 80' that is a "spiral" coil or "pancake" coil in communication with the plasma processing region 45 from above as in a transformer coupled plasma (TCP) reactor. The design and implementation of an inductively coupled plasma (ICP) source, or transformer coupled plasma (TCP) source, is well known to those skilled in the art.

Alternately, the plasma can be formed using electron cyclotron resonance (ECR). In yet another embodiment, the plasma is formed from the launching of a Helicon wave. In yet another embodiment, the plasma is formed from a propagating surface wave. Each plasma source described above is well known to those skilled in the art.

Figure 10:
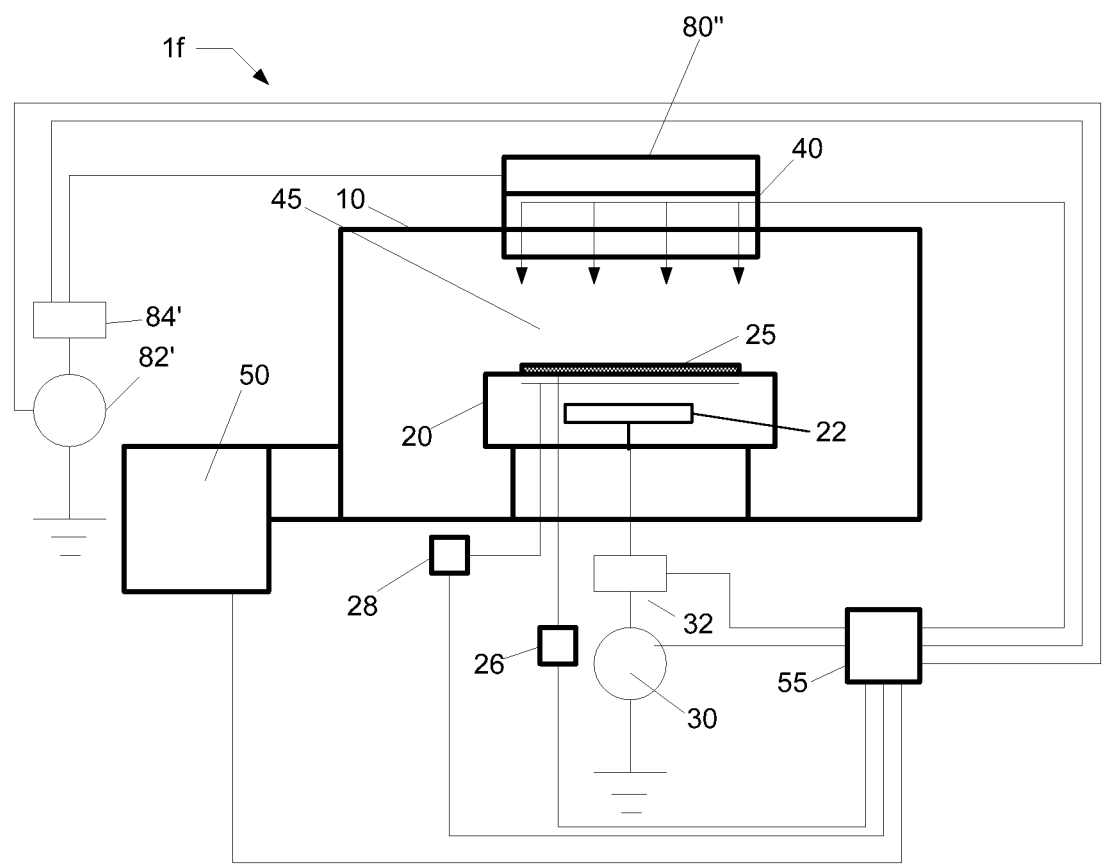
FIG. 10 shows a schematic representation of a processing system according to another embodiment.

In the embodiment shown in FIG. 10, the processing system 1f can be similar to the embodiments of FIGS. 3 and 4, and can further comprise a surface wave plasma (SWP) source 80''. The SWP source 80'' can comprise a slot antenna, such as a radial line slot antenna (RLSA), to which microwave power is coupled via microwave generator 82' through optional impedance match network 84'.

In the following discussion, a method of etching a feature in a thin film on a substrate is presented. For example, the processing system for performing dry plasma etching can comprise various elements, such as described in FIGS. 4 through 10, and combinations thereof.

In one embodiment, a method of transferring a feature pattern to a thin film on a substrate is described. The method comprises performing a first plasma etching process to reduce micro-loading effects, and performing a second plasma etching process to reduce feature roughness.

The first plasma etching process may comprise a process chemistry having a fluorocarbon-containing gas and an oxygen-containing gas. For example, a process parameter space can comprise a chamber pressure of about 80 mtorr or less, a fluorocarbon-containing gas process gas flow rate ranging from about 1 to about 1000 sccm, an oxygen-containing gas process gas flow rate ranging from about 1 to about 1000 sccm, an upper electrode (e.g., upper electrode 70 in FIG. 6) RF bias ranging from about 0 to about 2000 W, an upper electrode DC voltage ranging from about 0 V to about −2500 V, and a lower electrode (e.g., electrode 22 in FIG. 6) RF bias ranging from about 10 to about 1000 W. Also, the upper electrode bias frequency can range from about 0.1 MHz to about 200 MHz, e.g., 60 MHz. In addition, the lower electrode bias frequency can range from about 0.1 MHz to about 100 MHz, e.g., 2 MHz.

The second plasma etching process may comprise a process chemistry having a fluorocarbon-containing gas and an oxygen-containing gas. For example, a process parameter space can comprise a chamber pressure of about 80 mtorr or more, a fluorocarbon-containing gas process gas flow rate ranging from about 1 to about 1000 sccm, an oxygen-containing gas process gas flow rate ranging from about 1 to about 1000 sccm, an upper electrode (e.g., upper electrode 70 in FIG. 6) RF bias ranging from about 0 to about 2000 W, an upper electrode DC voltage ranging from about 0 V to about −2500 V, and a lower electrode (e.g., electrode 22 in FIG. 6) RF bias ranging from about 10 to about 1000 W. Also, the upper electrode bias frequency can range from about 0.1 MHz to about 200 MHz, e.g., 60 MHz. In addition, the lower electrode bias frequency can range from about 0.1 MHz to about 100 MHz, e.g., 2 MHz.

As described earlier, the adjustment or modulation of pressure between a first plasma etching process and a second plasma etching process may, among other things, cause a reduction in RIE lag (i.e., improvement/reduction of micro-loading effect) and reduction in feature roughness.

In one example, a method of etching a feature pattern in a thin film of porous low-k dielectric using a multi-layer mask is provided. Table 1 provides an exemplary process recipe for a conventional "one step" main etching process (i.e., one pressure) and a "two step" main etching process for transferring the feature pattern to the thin film. For each main etching process, a process condition is recited including a pressure (millitorr, mtorr) in the plasma processing chamber, an upper electrode (UEL) power (watts, W), a lower electrode (LEL) power (watts, W), an upper electrode DC voltage (volts, V), a $CF_4$ flow rate (standard cubic centimeters per minute, sccm), a CO flow rate, and time (seconds, sec).

Other process conditions for each of the process recipes listed in Table 1 include: backside helium gas pressures of 15 torr (center) and 40 torr (edge); UEL temperature (e.g., upper electrode 70 in FIG. 6)=60 degrees C.; and chamber wall temperature=60 degrees C.; and substrate holder temperature (e.g., substrate holder 20 in FIG. 6)=20 degrees C.

TABLE 2

| Etch condition | RIE Lag (%) | Bottom CD (nm) | LER (nm) |
| --- | --- | --- | --- |
| One step | 1.2 | 65.2 | 3.6 |
| Two step | −0.6 | 59.3 | 3.2 |

In addition to varying the pressure in the "two-step" main etching process (i.e., from 50 mtorr to 200 mtorr), other process parameters may be varied as well. For example, the UEL power, the LEL power, the UEL DC voltage, a flow rate, or a temperature, or any combination of two or more thereof may be varied.

The thin film of porous low-k dielectric, which includes a porous SiCOH-containing material formed using plasma-enhanced chemical vapor deposition (PECVD p-SiCOH), is inserted within a film stack having, from top to bottom, a lithographic layer, an ARC layer, a $SiO_x$ hard mask layer, an organic planarization layer (OPL), another $SiO_x$ hard mask layer, a SiCOH hard mask layer, the PECVD p-SiCOH layer, and a multi-layer etch stop layer.

A procedure for transferring a feature pattern through this film stack is as follows: (1) process step 1 transfers a feature pattern in the lithographic layer to the underlying ARC layer and $SiO_x$ hard mask layer; (2) process step 2 transfers the feature pattern in the ARC layer to the underlying OPL; (3) process step 3 transfers the feature pattern in the OPL to the underlying $SiO_x$ hard mask layer; (4) process step 4 provides an oxygen-containing flash process; (5) process step 5 transfers the feature pattern in the $SiO_x$ hard mask layer to an

TABLE 1

| Etch condition | Pressure (mtorr) | UEL Power (W) | LEL Power (W) | DC Voltage (V) | $CF_4$ Flow Rate (sccm) | CO Flow Rate (sccm) | Time (sec) |
| --- | --- | --- | --- | --- | --- | --- | --- |
| One step | 150 | 300 | 380 | −750 | 150 | 150 | 60 |
| Two step | 50 | 300 | 380 | −500 | 150 | 150 | 40 |
|  | 200 | 300 | 250 | −500 | 150 | 150 | 20 | underlying PECVD p-SiCOH layer (i.e., main etching process for transferring the feature pattern to the thin film as described above); (6) process step 6 provides a first ashing process; (7) process step 7 provides a second ashing process; (8) process step 8 provides a liner removal (LRM) process for etching a silicon nitride layer underlying the PECVD p-Si-COH layer; (9) process step 9 provides a de-fluorination cleaning (DFC) process to remove fluorine (F)-containing material from the substrate and the plasma processing system.

Using the process recipes provided in Table 1 for the main etching process step for the conventional "one step" process and the "two-step" process, several process parameters are provided in Table 2 for the resulting feature pattern in the low-k dielectric. The oxygen-containing flash process (i.e., process step 4 above) is used in the conventional "one step" process; however, this process step is not used in the "two-step" process. Additional details for the oxygen-containing flash process are provided in pending U.S. patent application Ser. No. 12/058,958, entitled "OXYGEN-CONTAINING PLASMA FLASH PROCESS FOR REDUCED MICRO-LOADING EFFECT AND CD BIAS", filed on Mar. 31, 2008; the content of which is herein incorporated by reference in its entirety.

As shown in Table 2, the use of the "two step" main etching process, which includes adjustment of the pressure between a first pressure less than 80 mtorr and a second pressure greater than 80 mtorr, causes, among other things, a reduction in RIE lag (%) and line edge roughness (LER) while maintaining CD. This improvement is observed when compared with the conventional "one-step" main etching process that is preceded by the oxygen-containing flash process. The reduction in RIE lag and LER is even greater when compared with the conventional "one-step" main etching process that is not preceded by the oxygen-containing flash process.

Further, as shown in Table 3, the use of the flash process causes, among other things: (1) a reduction in the CD bias (nanometers, nm) at both center and edge locations (C/E) by observation of the CD at feature pattern top (T), middle (M), and bottom (B); and (2) a reduction in RIE lag (%) at both center and edge locations (C/E). Clearly, Table 3 demonstrates a dramatic reduction in RIE lag when using the "two step" main etching process.

TABLE 3

| Etch condition | Center | | Edge | |
| --- | --- | --- | --- | --- |
| | Narrow line CD (T/M/B) | RIE Lag (%) | Narrow line CD (T/M/B) | RIE Lag (%) |
| One step | 111/103/81 | 4.1 | 106/99/64 | −1.8 |
| Two step | 105/101/82 | 0 | 97/91/81 | −1.2 |

Figure 11:
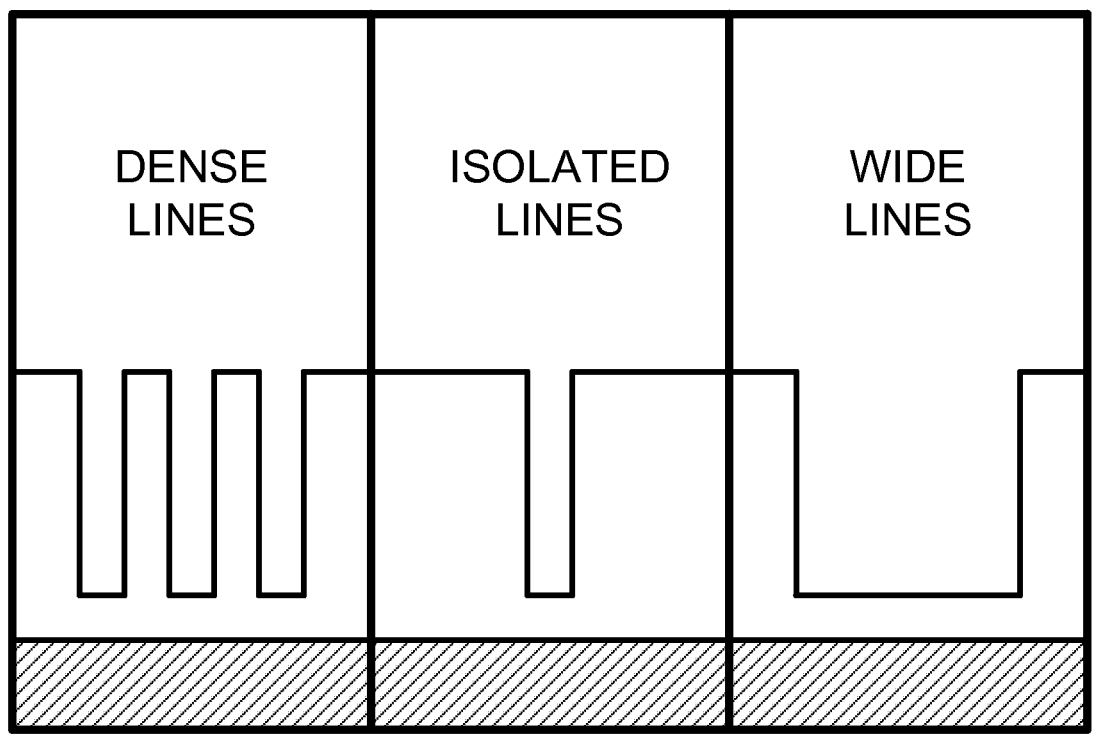
FIG. 11 illustrates several different feature patterns.

As illustrated in FIG. 11, the geometry and the pattern density of the feature patterns may vary. For example, dense lines (or dense vias/contacts) represent relatively closely spaced features, isolated lines (or isolated vias/contacts) represent relatively widely spaced features, and wide lines (or wide vias/contacts) represent relatively widely spaced features having a relatively wide lateral dimension (i.e., lower aspect ratio feature). The RIE lag (%), provided in Tables 2 and 3, is calculated as the difference between the etch depth in a wide line and the etch depth in a dense line divided by the etch depth in a dense line (multiplied by 100).

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

The invention claimed is:

1. A method of transferring a pattern to a substrate in a single-wafer plasma processing system, comprising:
    disposing a substrate comprising one or more mask layers overlying a thin film in said single-wafer plasma processing system;
    forming a feature pattern in said one or more mask layers;
    selecting a first process recipe including a first pressure of about 50 mTorr or less, a first etching chemistry comprising a first fluorocarbon-containing gas and a first oxygen-containing gas, a first fluorocarbon-containing gas flow rate of about 1-1000 sccm, a first oxygen-containing gas flow rate of about 1-1000 sccm, a first upper electrode RF bias of about 0-2000 W, a first upper electrode DC voltage of about 0 to about −2500 V, a first lower electrode RF bias of about 10-1000 W, and a first duration of time, and selecting a second process recipe including a second pressure of about 150 mTorr or greater, a second etching chemistry comprising a second fluorocarbon-containing gas and a second oxygen-containing gas, a second fluorocarbon-containing gas flow rate of about 1-1000 sccm, a second oxygen-containing gas flow rate of about 1-1000 sccm, a second upper electrode RF bias of about 0-2000 W, a second upper electrode DC voltage of about 0 to about −2500 V, a second lower electrode RF bias of about 10-1000 W, and a second duration of time, wherein said first process recipe is configured to reduce micro-loading in said feature pattern during a plasma etch transfer to said thin film and said second process recipe is configured to reduce feature roughness in said feature pattern during a plasma etch transfer to said thin film; and
    transferring said feature pattern in said one or more mask layers to said thin film by:
        performing a first plasma etching process using said first process recipe, and
        performing a second plasma etching process using said second process recipe,
    wherein said performing said first plasma etching process and said performing said second plasma etching process are alternatingly repeated two or more cycles until said pattern is transferred to said thin film.

2. The method of claim 1, wherein said performing said first plasma etching process precedes said performing said second plasma etching process.

3. The method of claim 2, wherein said first duration of time exceeds said second duration of time.

4. The method of claim 1, wherein said performing said first plasma etching process comprises:
    introducing said first etching chemistry to said plasma processing system according to said first fluorocarbon-containing gas flow rate and said first oxygen-containing gas flow rate;
    setting said selected first pressure, first upper electrode RF bias, first upper electrode DC voltage, and first lower electrode RF bias in said plasma processing system; and
    forming plasma from said first etching chemistry.

5. The method of claim 4, wherein said first fluorocarbon-containing gas is selected from the group consisting of $CF_4$, $C_3F_6$, $C_4F_6$, $C_4F_8$, $C_5F_8$, $CHF_3$, and $CH_2F_2$, and wherein said first oxygen-containing gas is selected from the group consisting of $O_2$, $CO$, $CO_2$, $NO$, $NO_2$, and $N_2O$.

6. The method of claim 5, wherein said first fluorocarbon-containing gas consists of $CF_4$ and said first oxygen-containing gas consists of CO.

7. The method of claim 4, further comprising:
introducing an inert gas to said plasma processing system with said first etching chemistry.

8. The method of claim 4, wherein said performing said second plasma etching process comprises:
introducing said second etching chemistry to said plasma processing system according to said second fluorocarbon-containing gas flow rate and said second oxygen-containing gas flow rate;
setting said selected second pressure, second upper electrode RF bias, second upper electrode DC voltage, and second lower electrode RF bias in said plasma processing system; and
forming plasma from said second etching chemistry.

9. The method of claim 8, wherein said second fluorocarbon-containing gas is selected from the group consisting of $CF_4$, $C_3F_6$, $C_4F_6$, $C_4F_8$, $C_5F_8$, $CHF_3$, and $CH_2F_2$, and wherein said second oxygen-containing gas is selected from the group consisting of $O_2$, CO, $CO_2$, NO, $NO_2$, and $N_2O$.

10. The method of claim 9, wherein said second fluorocarbon-containing gas consists of $CF_4$ and said second oxygen-containing gas consists of $O_2$.

11. The method of claim 8, further comprising:
introducing an inert gas to said plasma processing system with said second etching chemistry.

12. The method of claim 1, wherein said thin film comprises a porous dielectric film or a non-porous dielectric film.

13. The method of claim 1, wherein said thin film comprises an inorganic material, or an inorganic-organic hybrid material.

14. The method of claim 1, wherein said thin film comprises a collective film including silicon, carbon, oxygen, and optionally hydrogen.

15. The method of claim 8, wherein said first and second fluorocarbon-containing gases consist of $CF_4$, said first oxygen-containing gas consists of CO and said second oxygen-containing gas consists of $O_2$.

* * * * *